(12) United States Patent
Li et al.

(10) Patent No.: US 10,153,447 B2
(45) Date of Patent: Dec. 11, 2018

(54) ORGANIC SOLAR CELL AND PREPARATION METHOD THEREOF

(71) Applicant: Huawei Technologies Co., Ltd., Shenzhen, Guangdong (CN)

(72) Inventors: Hui Li, Shenzhen (CN); Shengan Xia, Shenzhen (CN); Fengchao Xie, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 156 days.

(21) Appl. No.: 15/387,253

(22) Filed: Dec. 21, 2016

(65) Prior Publication Data

US 2017/0104169 A1   Apr. 13, 2017

Related U.S. Application Data

(63) Continuation of application No. PCT/CN2015/070710, filed on Jan. 14, 2015.

(30) Foreign Application Priority Data

Jun. 27, 2014   (CN) .......................... 2014 1 0299943

(51) Int. Cl.
*H01L 51/42*     (2006.01)
*H01L 31/18*     (2006.01)
(Continued)

(52) U.S. Cl.
CPC ...... *H01L 51/4253* (2013.01); *C01B 21/0605* (2013.01); *H01L 31/032* (2013.01);
(Continued)

(58) Field of Classification Search
CPC ............. H01L 51/4253; H01L 51/4246; H01L 31/0236; H01L 31/0248; H01L 31/0256; H01L 31/032; H01L 31/18
See application file for complete search history.

(56) References Cited

U.S. PATENT DOCUMENTS

| 2013/0199605 A1 | 8/2013 | Huang et al. |
| 2014/0295179 A1* | 10/2014 | Naito .................... B82Y 10/00 428/339 |

(Continued)

FOREIGN PATENT DOCUMENTS

| CN | 102280589 A | 12/2011 |
| CN | 102386332 A | 3/2012 |

(Continued)

OTHER PUBLICATIONS

CN-103193785-A, English equivalent of the abstract. 2013 (Year: 2013).*

(Continued)

*Primary Examiner* — Susan D Leong

(57) ABSTRACT

An organic solar cell device is provided, including a first electrode, a photoactive layer, a hole transport layer, and a second electrode that are stacked successively. The photoactive layer includes an electron receptor material and an electron donor material. The electron receptor material is graphene nitride that forms a foamy film on the first electrode and has a three-dimensional network structure. A part of the electron donor material permeates into the graphene nitride, and a part of the electron donor material is enriched on a side of the hole transport layer to form an electron donor enriched layer.

20 Claims, 1 Drawing Sheet

(51) Int. Cl.
*H01L 31/032* (2006.01)
*H01L 51/00* (2006.01)
*H01L 31/0236* (2006.01)
*C01B 21/06* (2006.01)
*H01L 31/0256* (2006.01)

(52) U.S. Cl.
CPC ...... *H01L 51/0003* (2013.01); *H01L 51/0026* (2013.01); *H01L 51/426* (2013.01); *C01P 2006/40* (2013.01); *H01L 51/0035* (2013.01); *H01L 51/0036* (2013.01); *H01L 51/0037* (2013.01); *H01L 51/0043* (2013.01); *H01L 2031/0344* (2013.01); *Y02E 10/549* (2013.01)

(56) References Cited

U.S. PATENT DOCUMENTS

2014/0360564 A1* 12/2014 Ng .................. H01G 9/2072
 136/254
2015/0083206 A1* 3/2015 Novoselov ............ B82Y 30/00
 136/256

FOREIGN PATENT DOCUMENTS

CN 102543469 A 7/2012
CN 103193785 A * 7/2013
CN 103367641 A 10/2013

OTHER PUBLICATIONS

Yang et al. "Graphite carbon nitride/boron-doped graphene hybrid for efficient hydrogen generation reaction" Nanotechnology, V29, No. 34, 2018, 345705, 8 pages (Year: 2018).*

Qian Liu, et al., "Polymer Photovoltaic Cells Based on Solution-Processable Graphene and P3HT," Advanced Functional Materials, Wiley-VCH Verlag GmbH & Co. KGaA, Weinheim, DE, vol. 19, No. 6, Mar. 24, 2009, pp. 894-904, XP001521174.

Yuhua Xue, et al., "Nitrogen-Doped Graphene Foams as Metal-Free Counter Electrodes in High-Performance Dye-Sensitized Solar Cells," Angew. Chem. Int. Ed., Wiley-VCH Verlag GmbH & Co. KGaA, Weineim, DE, vol. 51, Nov. 4, 2012, pp. 12124-12127, XP002769482.

* cited by examiner

ORGANIC SOLAR CELL AND PREPARATION METHOD THEREOF

CROSS-REFERENCE TO RELATED APPLICATIONS

This application is a continuation of International Application No. PCT/CN2015/070710, filed on Jan. 14, 2015, which claims priority to Chinese Patent Application No. 201410299943.9, filed on Jun. 27, 2014. The disclosures of the aforementioned applications are hereby incorporated by reference in their entireties.

TECHNICAL FIELD

The present application relates to organic solar cells, and in particular, to an organic solar cell and a preparation method thereof.

BACKGROUND

Currently, single-layer device efficiency of an organic bulk heterojunction solar cell has almost reached a level of 10% for commercial use. The efficiency is achieved mainly thanks to introduction of a bulk heterojunction device structure. A bulk heterojunction structure is essentially an interpenetrating network structure, and this structure facilitates electron transfer between a donor material and a receptor material.

Currently, a receptor material used in the bulk heterojunction solar cell is usually a fullerene derivative material. The fullerene derivative material has excellent charge transport performance, and matches most donor materials well in terms of an energy level structure. In addition, a fullerene has an advantage of being isotropic in charge transport thanks to a spherical structure of the fullerene, thereby further facilitating charge transport. However, a fullerene receptor material is prone to gather during preparation of an active layer, and therefore, an effective area for charge transport of the fullerene receptor material decreases. In addition, because material preparation and purification are difficult, it is difficult for the fullerene receptor material to be commercially applied.

To find another receptor material to replace the fullerene material, researchers have reported a large quantity of receptor materials. However, these materials cannot be widely applied due to problems of charge transport performance, solubility, and the like. Carbon materials such as graphene and a carbon nanotube are comparable to the fullerene in terms of properties such as a charge transport capability and stability, and therefore, attract attention of the industry. However, because relatively low energy levels of the graphene and the carbon nanotube cannot match an energy level of the donor material, a solar device prepared by using the graphene or the carbon nanotube has a very low open-circuit voltage, and a cell is impractical.

SUMMARY

In view of this, a first aspect of embodiments of the present application provides an organic solar cell, to resolve the following problems in the prior art: a solar cell device prepared by using graphene has a low open-circuit voltage and is impractical because an energy level of the graphene cannot match an energy level of a donor material; and currently, a receptor material used in an organic solar cell is single.

According to a first aspect, an embodiment of the present application provides an organic solar cell, including a first electrode, a photoactive layer, a hole transport layer, and a second electrode that are stacked successively, where the photoactive layer includes an electron receptor material and an electron donor material; the electron receptor material is graphene nitride; the graphene nitride forms a foamy film on the first electrode; the graphene nitride has a three-dimensional network structure; a part of the electron donor material permeates into the graphene nitride, and a part of the electron donor material is enriched on a side of the hole transport layer to form an electron donor enriched layer; the graphene nitride and the electron donor material form a bulk heterojunction structure; the first electrode is conductive glass; and the second electrode is a metal electrode.

In an implementation manner of the present application, a thickness of the film formed by the graphene nitride is 10-100 nm.

In an implementation manner of the present application, a mass content of a nitrogen element in the graphene nitride is 0.1%-14%.

In an implementation manner of the present application, the graphene nitride forms an electron receptor enriched layer on a side close to the first electrode.

In an implementation manner of the present application, the electron donor material is at least one of a material containing a thiophene unit, a material containing a dithienobenzene unit, or a material containing a dithienosilole unit.

In an implementation manner of the present application, the electron donor material is at least one of poly(3-hexylthiophene), poly[[9-(1-octylnonyl)-9H-carbazol-2,7-diyl]-2,5-thiophenediyl-2,1,3-benzothiadiazole-4,7-diyl-2,5-thiophenediyl], or 5;5'-bis[(4-(7-hexylthiophene-2-yl)thiophene-2-yl)-[1,2,5]thiadiazole[3,4-c]pyrimidin]-3;3'-di-2-ethylhexylsilylene-2;2'bithiophene (DTS(PTTh2)2).

In an implementation manner of the present application, a thickness of the photoactive layer is 30-250 nm.

In an implementation manner of the present application, the conductive glass is FTO or ITO conductive glass.

In an implementation manner of the present application, a material of the metal electrode is a metal of aluminum, silver, or gold.

In an implementation manner of the present application, a material of the hole transport layer is molybdenum trioxide or poly(3,4-ethylenedioxythiophene)-poly(styrenesulfonate) (PEDOT:PSS).

According to the organic solar cell device provided in the first aspect of the embodiments of the present application, graphene nitride is used as a receptor material. An energy level of the graphene nitride can match an energy level of a donor material. The graphene nitride and an organic donor material can better form an interpenetrating network structure by means of constructing a three-dimensional network structure, thereby facilitating charge separation. In this way, an open-circuit voltage is ensured, a short-circuit current is enhanced, and energy conversion efficiency of the solar cell is improved.

According to a second aspect, an embodiment of the present application provides a method for preparing an organic solar cell device, including the following steps:

ultrasonically dispersing graphene nitride in a mixed solution formed by water and polyethylene glycol, to obtain a graphene nitride dispersion liquid; coating a first electrode with the graphene nitride dispersion liquid; and then, performing heat treatment to remove the polyethylene glycol, to obtain a foamy graphene nitride film, where the foamy graphene nitride film has a three-dimensional network structure; and coating the foamy graphene nitride film with an electron donor material, where apart of the electron donor material permeates into the graphene nitride, and a part of the electron donor material is enriched on the graphene nitride film to form an electron donor enriched layer; forming a bulk heterojunction structure by the electron receptor material and the electron donor material to obtain a photoactive layer; and then performing vapor deposition at the photoactive layer to successively prepare a hole transport layer and a second electrode, to obtain the organic solar cell device.

In an implementation manner of the present application, a thickness of the foamy graphene nitride film is 10-100 nm.

In an implementation manner of the present application, a concentration of the graphene nitride dispersion liquid is 0.1-10 mg/mL.

In an implementation manner of the present application, manners of the coating include blade coating and spin coating, and the heat treatment is performed at 200° C.-500° C.

In an implementation manner of the present application, a number-average molecular weight of the polyethylene glycol is 1000-5000, and a mass concentration of the polyethylene glycol in the mixed solution is 2-10%.

In an implementation manner of the present application, the graphene nitride is prepared in the following manner:

placing graphene oxide in a mixed atmosphere of ammonia and nitrogen; heating the graphene oxide at 600-1000° C. for 0.5-3 hours; maintaining a mixed gas flow after the heating stops; and stopping inputting ammonia when a room temperature is reached, to obtain the graphene nitride.

In another implementation manner of the present application, the graphene nitride is prepared in the following manner:

adding an appropriate amount of urea to an aqueous graphene oxide solution, to obtain a mixed solution; placing the mixed solution in a polytetrafluoroethylene autoclave; reacting at 100-250° C. for 6-20 hours, to obtain a solid product; and after the solid product cools down, filtering, water washing, and drying the solid product to obtain the graphene nitride.

In an implementation manner of the present application, the electron donor material is at least one of a material containing a thiophene unit, a material containing a dithienobenzene unit, or a material containing a dithienosilole unit.

In an implementation manner of the present application, the electron donor material is at least one of poly(3-hexylthiophene), poly[[9-(1-octylnonyl)-9H-carbazol-2,7-diyl]-2,5-thiophenediyl-2,1,3-benzothiadiazole-4,7-diyl-2,5-thiophenediyl], or DTS(PTTh2)2.

In an implementation manner of the present application, a thickness of the photoactive layer is 30-250 nm.

In an implementation manner of the present application, the conductive glass is FTO or ITO conductive glass.

In an implementation manner of the present application, a material of the metal electrode is a metal of aluminum, silver, or gold.

In an implementation manner of the present application, a material of the hole transport layer is molybdenum trioxide or poly(3,4-ethylenedioxythiophene)-poly(styrenesulfonate) (PEDOT:PSS).

The method for preparing an organic solar cell device provided in the second aspect of the embodiments of the present application has a simple process, and is applicable to industrial production.

In conclusion, according to the organic solar cell device provided in the first aspect of the embodiments of the present application, graphene nitride is used as a receptor material. An energy level of the graphene nitride can match an energy level of a donor material. The graphene nitride and an organic donor material better form an interpenetrating network structure by means of constructing a three-dimensional network structure, thereby facilitating charge separation. In this way, an open-circuit voltage is ensured, a short-circuit current is enhanced, and energy conversion efficiency of the solar cell is improved. The method for preparing an organic solar cell device provided in the second aspect of the embodiments of the present application has a simple process, and is applicable to industrial production.

Advantages of the embodiments of the present application are to be described in the following specification. Some advantages are obvious according to this specification, or may be learned through implementation of the embodiments of the present application.

BRIEF DESCRIPTION OF THE DRAWING

FIG. 1 is a schematic structural diagram of an organic solar cell device according to an embodiment of the present application.

DETAILED DESCRIPTION

The following descriptions are exemplary implementation manners of the embodiments of the present application. It should be noted that a person of ordinary skill in the art may make several improvements or polishing without departing from the principle of the embodiments of the present application and the improvements or polishing shall fall within the protection scope of the embodiments of the present application.

A first aspect of the embodiments of the present application provides an organic solar cell to resolve the following problems in the prior art: a solar cell device prepared by using graphene has a low open-circuit voltage and is impractical because an energy level of the graphene cannot match an energy level of a donor material; and currently, a single receptor material is used in an organic solar cell.

According to a first aspect, an embodiment of the present application provides an organic solar cell, including a first electrode, a photoactive layer, a hole transport layer, and a second electrode that are stacked successively. The photoactive layer includes an electron receptor material and an electron donor material. The electron receptor material is graphene nitride. The graphene nitride forms a foamy film on the first electrode. The graphene nitride has a three-dimensional network structure. A part of the electron donor material permeates into the graphene nitride, and a part of the electron donor material is enriched on a side of the hole transport layer to form an electron donor enriched layer. The graphene nitride and the electron donor material form a bulk heterojunction structure. The first electrode is conductive glass, and the second electrode is a metal electrode.

FIG. 1 is a schematic structural diagram of an organic solar cell device according to an embodiment of the present application. 10 is conductive glass, 20 is a photoactive layer, 30 is a hole transport layer, and 40 is a metal electrode. The photoactive layer 20 includes an electron receptor material a and an electron donor material b. The electron receptor material a and the electron donor material b form a bulk heterojunction structure, that is, form a desirable interpenetrating network structure. In the entire photoactive layer 20, an electron receptor enriched layer 21 is formed at an end close to the conductive glass 10, an electron donor enriched layer 22 is formed at an end close to the hole transport layer 30, which can effectively prevent charge returning.

The bulk heterojunction structure is essentially the interpenetrating network structure, and this structure facilitates electron transfer between a donor material and a receptor material. An energy level of graphene nitride is close to that of a fullerene, and the graphene nitride has desirable conductivity. Foamy graphene nitride has a desirable three-dimensional network structure, can be used as a desirable receptor support material, and can better form the interpenetrating network structure with an organic photovoltaic donor material, thereby facilitating charge separation. In this way, an open-circuit voltage is ensured, a short-circuit current is enhanced, and energy conversion efficiency of the solar cell is improved.

In an implementation manner of the present application, a thickness of the film formed by the graphene nitride is 10-100 nm.

In an implementation manner of the present application, a mass content of a nitrogen element in the graphene nitride is 0.1%-14%.

In an implementation manner of the present application, the graphene nitride forms an electron receptor enriched layer on aside close to the first electrode.

In an implementation manner of the present application, the electron donor material is at least one of a material containing a thiophene unit, a material containing a dithienobenzene unit, or a material containing a dithienosilole unit.

In an implementation manner of the present application, the electron donor material is at least one of poly(3-hexylthiophene), poly[[9-(1-octylnonyl)-9H-carbazol-2,7-diyl]-2,5-thiophenediyl-2,1,3-benzothiadiazole-4,7-diyl-2,5-thiophenediyl], or DTS(PTTh2)2.

In an implementation manner of the present application, a thickness of the photoactive layer is 30-250 nm.

In an implementation manner of the present application, the conductive glass is FTO or ITO conductive glass.

In an implementation manner of the present application, a material of the metal electrode is a metal of aluminum, silver, or gold.

In an implementation manner of the present application, a material of the hole transport layer is molybdenum trioxide or poly(3,4-ethylenedioxythiophene)-poly(styrenesulfonate) (PEDOT:PSS).

According to the organic solar cell device provided in the first aspect of the embodiments of the present application, graphene nitride is used as a receptor material. An energy level of the graphene nitride can match an energy level of a donor material. The graphene nitride and an organic donor material can better foul an interpenetrating network structure by means of constructing a three-dimensional network structure, thereby facilitating charge separation. In this way, an open-circuit voltage is ensured, a short-circuit current is enhanced, and energy conversion efficiency of the solar cell is improved.

According to a second aspect, an embodiment of the present application provides a method for preparing an organic solar cell device, including the following steps:

ultrasonically dispersing graphene nitride in a mixed solution formed by water and polyethylene glycol, to obtain a graphene nitride dispersion liquid; coating a first electrode with the graphene nitride dispersion liquid; and then, performing heat treatment to remove the polyethylene glycol, to obtain a foamy graphene nitride film, where the foamy graphene nitride film has a three-dimensional network structure; and coating the foamy graphene nitride film with an electron donor material, where apart of the electron donor material permeates into the graphene nitride, and a part of the electron donor material is enriched on the graphene nitride film to form an electron donor enriched layer; forming a bulk heterojunction structure by the electron receptor material and the electron donor material, to obtain a photoactive layer; and then performing vapor deposition at the photoactive layer to successively prepare a hole transport layer and a second electrode, to obtain the organic solar cell device.

In an implementation manner of the present application, a thickness of the foamy graphene nitride film is 10-100 nm.

In an implementation manner of the present application, a concentration of the graphene nitride dispersion liquid is 0.1-10 mg/mL.

In an implementation manner of the present application, manners of the coating include blade coating and spin coating, and the heat treatment is performed at 200° C.-500° C.

In an implementation manner of the present application, a number-average molecular weight of the polyethylene glycol is 1000-5000, and a mass concentration of the polyethylene glycol in the mixed solution is 2-10%.

In an implementation manner of the present application, the graphene nitride is prepared in the following manner:

placing graphene oxide in a mixed atmosphere of ammonia and nitrogen; heating the graphene oxide at 600-1000° C. for 0.5-3 hours; maintaining a mixed gas flow after the heating stops; and stopping inputting ammonia when a room temperature is reached, to obtain the graphene nitride.

In another implementation manner of the present application, the graphene nitride is prepared in the following manner:

adding an appropriate amount of urea to an aqueous graphene oxide solution, to obtain a mixed solution; placing the mixed solution in a polytetrafluoroethylene autoclave; reacting at 100-250° C. for 6-20 hours, to obtain a solid product; and after the solid product cools down, filtering, water washing, and drying the solid product to obtain the graphene nitride.

In an implementation manner of the present application, the electron donor material is at least one of a material containing a thiophene unit, a material containing a dithienobenzene unit, or a material containing a dithienosilole unit.

In an implementation manner of the present application, the electron donor material is at least one of poly(3-hexylthiophene), poly[[9-(1-octylnonyl)-9H-carbazol-2,7-diyl]-2,5-thiophenediyl-2,1,3-benzothiadiazole-4,7-diyl-2,5-thiophenediyl], or DTS(PTTh2)2.

In an implementation manner of the present application, a thickness of the photoactive layer is 30-250 nm.

In an implementation manner of the present application, the conductive glass is FTO or ITO conductive glass.

In an implementation manner of the present application, a material of the metal electrode is a metal of aluminum, silver, or gold.

In an implementation manner of the present application, a material of the hole transport layer is molybdenum trioxide or poly(3,4-ethylenedioxythiophene)-poly(styrenesulfonate) (PEDOT:PSS).

The method for preparing an organic solar cell device provided in the second aspect of the embodiments of the present application has a simple process, and is applicable to industrial production.

In conclusion, according to the organic solar cell device provided in the first aspect of the embodiments of the present application, graphene nitride is used as a receptor material. An energy level of the graphene nitride can match an energy level of a donor material. The graphene nitride and an organic donor material better form an interpenetrating network structure by means of constructing a three-dimensional network structure, thereby facilitating charge separation. In this way, an open-circuit voltage is ensured, a short-circuit current is enhanced, and energy conversion efficiency of the solar cell is improved. The method for preparing an organic solar cell device provided in the second aspect of the embodiments of the present application has a simple process, and is applicable to industrial production.

The following further describes the embodiments of the present application by using multiple embodiments. The embodiments of the present application are not limited to the following specific embodiments. Appropriate modifications may be made to implementation without departing from the scope of the claims.

Embodiment 1

A method for preparing an organic solar cell includes the following steps:

placing graphene oxide in a horizontal quartz furnace; in a mixed atmosphere of ammonia and nitrogen (a volume ratio=1:1), heating the graphene oxide in the furnace at 800° C. for one hour; maintaining a mixed gas flow after the heating stops; stopping inputting ammonia when a quartz tube cools down to a room temperature; and taking a product out of the quartz furnace, to obtain graphene nitride;

ultrasonically dispersing the foregoing obtained graphene nitride in a mixed solution formed by water and polyethylene glycol (a number-average molecular weight is 2000), to obtain a graphene nitride dispersion liquid with a concentration of 10 mg/mL, where a mass concentration of the polyethylene glycol in the mixed solution is 5%;

ultrasonically washing ITO glass by successively using detergent, chloroform, and acetone, and then blow-drying, by using nitrogen, a conductive surface of the washed conductive glass for subsequent use;

spin-coating the conductive surface of the clean ITO glass with the graphene nitride dispersion liquid, and then performing heat treatment at 400° C. on the ITO glass that is spin-coated with the graphene nitride dispersion liquid, to remove the polyethylene glycol and obtain a foamy graphene nitride film with a thickness of 40 nm, where the foamy graphene nitride film has a three-dimensional network structure;

spin-coating the foamy graphene nitride film with a chlorobenzene solution in which a concentration of P3HT is 15 mg/ml, where a part of the P3HT permeates into the graphene nitride, and a part of the P3HT is enriched on the foamy graphene nitride film to form an electron donor enriched layer; and forming a bulk heterojunction structure by the graphene nitride and the P3HT to obtain a photoactive layer, where a thickness of the photoactive layer is 200 nm; and performing vapor deposition at the P3HT to obtain an $MoO_3$ hole transport layer with a thickness of 2 nm, and then performing vapor deposition at the hole transport layer to obtain an aluminum electrode with a thickness of 100 nm, to obtain an organic solar cell device.

Embodiment 2

A method for preparing an organic solar cell includes the following steps:

diluting, by using 25 mL of deionized water, 10 mL of an aqueous graphene oxide solution with a concentration of 4 mg/mL; adding a small amount of urea to obtain a mixed solution; placing the mixed solution in a 50 mL polytetrafluoroethylene autoclave; reacting at 180° C. for 12 hours, to obtain a solid product; and after the solid product cools down, filtering, water washing, and drying the solid product to obtain graphene nitride;

ultrasonically dispersing the foregoing obtained graphene nitride in a mixed solution formed by water and polyethylene glycol (a number-average molecular weight is 2000), to obtain a graphene nitride dispersion liquid with a concentration of 10 mg/mL, where a mass concentration of the polyethylene glycol in the mixed solution is 5%;

ultrasonically washing FTO glass by successively using detergent, chloroform, and acetone, and then blow-drying, by using nitrogen, a conductive surface of the washed conductive glass for subsequent use;

spin-coating the conductive surface of the clean FTO glass with the graphene nitride dispersion liquid, and then performing heat treatment at 400° C. on the FTO glass that is spin-coated with the graphene nitride dispersion liquid, to remove the polyethylene glycol and obtain a foamy graphene nitride film with a thickness of 50 nm, where the foamy graphene nitride film has a three-dimensional network structure;

spin-coating the foamy graphene nitride film with a chlorobenzene solution in which a concentration of PCDTBT is 15 mg/ml, where a part of the PCDTBT permeates into the graphene nitride, and a part of the PCDTBT is enriched on the foamy graphene nitride film to form an electron donor enriched layer; and forming a bulk heterojunction structure by the graphene nitride and the PCDTBT to obtain a photoactive layer, where a thickness of the photoactive layer is 200 nm; and performing vapor deposition at the PCDTBT to obtain an $MoO_3$ hole transport layer with a thickness of 2 nm, and then performing vapor deposition at the hole transport layer to obtain an aluminum electrode with a thickness of 100 nm, to obtain an organic solar cell device.

Comparative Embodiment

ITO glass is ultrasonically washed by successively using detergent, chloroform, and acetone successively, and then a conductive surface of the washed conductive glass is blow-dried for subsequent use by using nitrogen.

The ITO glass is spin-coated with a mixed solution of P3HT and PCBM (a fullerene derivative) to form a photoactive layer, where a solvent of the mixed solution is chlorobenzene, a concentration of the P3HT is 10 mg/ml, a concentration of the PCBM is 10 mg/ml, and a thickness of a photoactive layer film is 100 nm.

Vapor deposition is performed at the photoactive layer film to obtain an $MoO_3$ hole transport layer with a thickness of 2 nm, and then vapor deposition is performed at the hole transport layer to obtain an aluminum electrode with a thickness of 100 nm, to obtain a complete organic solar cell device.

Effect Embodiments

To strongly support beneficial effects of the embodiments of the present application, an effect embodiment is provided as follows and is used to evaluate performance of a product provided in the embodiments of the present application.

Performance tests are performed, under illumination with intensity of 100 mW/cm², on the organic solar cell devices that are separately prepared in Embodiment 1 and Embodiment 2 of the present application and Comparative embodiment, and results are as follows:

Embodiment 1

An open-circuit voltage $V_{OC}$ of a cell is 0.6 V, short-circuit current density $J_{sc}$ is 7.0 mA/cm², a fill factor FF is 60.5%, and energy conversion efficiency η is 2.54%.

Embodiment 2

An open-circuit voltage $V_{OC}$ of a cell is 0.81 V, short-circuit current density $J_{sc}$ is 6.71 mA/cm², a fill factor FF is 58.5%, and energy conversion efficiency η is 3.18%.

Comparative Embodiment

An open-circuit voltage $V_{OC}$ of a cell is 0.59 V, short-circuit current density $J_{sc}$ is 5.71 mA/cm², a fill factor FF is 55.7%, and energy conversion efficiency η is 1.88%.

According to the organic solar cell device of the embodiments of the present application, graphene nitride is used as a receptor material. An energy level of the graphene nitride can match an energy level of a donor material. The graphene nitride and an organic donor material better form an interpenetrating network structure by means of constructing a three-dimensional network structure, thereby facilitating charge separation. In this way, an open-circuit voltage is ensured, a short-circuit current is enhanced, and energy conversion efficiency of the solar cell is improved.

What is claimed is:

1. An organic solar cell device, comprising:
a first electrode comprising conductive glass;
a photoactive layer, comprising an electron receptor material and an electron donor material, the electron receptor material comprising graphene nitride forming a foamy film on the first electrode and having a three-dimensional network structure;
a hole transport layer;
a second electrode being a metal electrode and stacked successively; and
wherein a part of the electron donor material permeates into the graphene nitride, and a part of the electron donor material is enriched on a side of the hole transport layer to form an electron donor enriched layer, the graphene nitride and the electron donor material form a bulk heterojunction structure.

2. The organic solar cell device according to claim 1, wherein a thickness of the film formed by the graphene nitride is 10-100 nm.

3. The organic solar cell device according to claim 1 wherein a mass content of a nitrogen element in the graphene nitride is 0.1%-14%.

4. The organic solar cell device according to claim 1, wherein the graphene nitride forms an electron receptor enriched layer on a side close to the first electrode.

5. The organic solar cell device according to claim 1, wherein the electron donor material comprises a material comprising a thiophene unit, a material containing a dithienobenzene unit, or a material containing a dithienosilole unit.

6. The organic solar cell device according to claim 5, wherein the electron donor material comprises at least one of:
poly(3-hexylthiophene);
poly[[9-(1-octylnonyl)-9H-carbazol-2,7-diyl]-2,5-thiophenediyl-2,1,3-benzothiadiazole-4,7-diyl-2,5-thiophenediyl]; or
5;5'-bis[(4-(7-hexylthiophene-2-yl)thiophene-2-yl)-[1,2,5]thiadiazole[3,4-c]pyrimidin]-3;3'-di-2-ethylhexylsilylene-2;2'bithiophene.

7. The organic solar cell device according to claim 1, wherein a thickness of the photoactive layer is 30-250 nm.

8. The organic solar cell device according to claim 1, wherein the conductive glass is FTO or ITO conductive glass.

9. The organic solar cell device according to claim 1, wherein the metal electrode comprises aluminum, silver, or gold.

10. The organic solar cell device according to claim 8, wherein the hole transport layer comprises molybdenum trioxide or poly(3,4-ethylenedioxythiophene)-poly(styrenesulfonate).

11. A method for preparing an organic solar cell device, the method comprising:
ultrasonically dispersing graphene nitride in a mixed solution formed by water and polyethylene glycol, to obtain a graphene nitride dispersion liquid;
coating a first electrode with the graphene nitride dispersion liquid;
performing heat treatment to remove the polyethylene glycol, to obtain a foamy graphene nitride film having a three-dimensional network structure;
coating the foamy graphene nitride film with an electron donor material, wherein a part of the electron donor material permeates into the graphene nitride, and a part of the electron donor material is enriched on the graphene nitride film to form an electron donor enriched layer;
forming a bulk heterojunction structure by the electron receptor material and the electron donor material to obtain a photoactive layer; and
performing vapor deposition at the photoactive layer to successively prepare a hole transport layer and a second electrode, to obtain the organic solar cell device.

12. The method according to claim 11, wherein a thickness of the foamy graphene nitride film is 10-100 nm.

13. The method according to claim 11, wherein a concentration of the graphene nitride dispersion liquid is 0.1-10 mg/mL.

14. The method according to claim 11, wherein manners of the coating comprise blade coating and spin coating, and the heat treatment is performed at 200° C.-500° C.

15. The method according to claim 11, wherein a number-average molecular weight of the polyethylene glycol is 1000-5000, and a mass concentration of the polyethylene glycol in the mixed solution is 2-10%.

16. The method according to claim 11, wherein the graphene nitride is prepared in the following manner:

placing graphene oxide in a gas mixture of ammonia and nitrogen;

heating the graphene oxide at 600-1000° C. for 0.5-3 hours;

maintaining the gas mixture flow after the heating stops; and stopping inputting ammonia when a room temperature is reached, to obtain the graphene nitride.

17. The method according to claim 11, wherein the graphene nitride is prepared in the following manner:

adding an appropriate amount of urea to an aqueous graphene oxide solution, to obtain a mixed solution;

placing the mixed solution in a polytetrafluoroethylene autoclave;

reacting at 100-250° C. for 6-20 hours, to obtain a solid product; and after the solid product cools down, filtering, water washing, and drying the solid product to obtain the graphene nitride.

18. The method according to claim 11, wherein the electron donor material comprises a material comprising a thiophene unit, a material containing a dithienobenzene unit, or a material containing a dithienosilole unit.

19. The method according to claim 11, wherein the electron donor material comprises at least one of:

poly(3-hexylthiophene);

poly[[9-(1-octylnonyl)-9H-carbazol-2,7-diyl]-2,5-thiophenediyl-2,1,3-benzothiadiazole-4,7-diyl-2,5-thiophenediyl]; or 5;5'-bis[(4-(7-hexylthiophene-2-yl)thiophene-2-yl)-[1,2,5]thiadiazole[3,4-c]pyrimidin]-3;3'-di-2-ethylhexylsilylene-2;2'bithiophene.

20. The method according to claim 19, wherein a thickness of the photoactive layer is 30-250 nm.

* * * * *